United States Patent
Wei et al.

(10) Patent No.: US 9,048,347 B2
(45) Date of Patent: Jun. 2, 2015

(54) EPITAXIAL STRUCTURE INCLUDING CARBON NANOTUBE LAYER IN GROOVES

(71) Applicants: Yang Wei, Beijing (CN); Shou-Shan Fan, Beijing (CN)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 189 days.

(21) Appl. No.: 13/647,445

(22) Filed: Oct. 9, 2012

(65) Prior Publication Data

US 2013/0256628 A1  Oct. 3, 2013

(30) Foreign Application Priority Data

Mar. 28, 2012 (CN) .......................... 2012 1 0085266

(51) Int. Cl.
| | |
|---|---|
| H01L 21/20 | (2006.01) |
| H01L 33/00 | (2010.01) |
| H01L 21/02 | (2006.01) |
| H01L 33/16 | (2010.01) |
| H01L 33/20 | (2010.01) |

(52) U.S. Cl.
CPC ............... *H01L 33/007* (2013.01); *H01L 33/16* (2013.01); *H01L 33/20* (2013.01); *H01L 21/0237* (2013.01); *H01L 21/0243* (2013.01); *H01L 21/02444* (2013.01); *H01L 21/02513* (2013.01); *H01L 21/02521* (2013.01); *H01L 21/0262* (2013.01); *H01L 21/02642* (2013.01); *H01L 21/02647* (2013.01)

(58) Field of Classification Search
CPC ....................................................... H01L 21/20
USPC .......... 257/12, 9, E29.086, 26, 618; 438/478, 438/496
See application file for complete search history.

(56) References Cited

U.S. PATENT DOCUMENTS

| | | | |
|---|---|---|---|
| 8,309,051 B2 | 11/2012 | Yao et al. | |
| 2009/0321715 A1* | 12/2009 | Kobayashi et al. | ............. 257/14 |
| 2010/0181896 A1 | 7/2010 | Lee et al. | |
| 2011/0049568 A1* | 3/2011 | Lochtefeld et al. | ........... 257/190 |
| 2011/0052477 A1 | 3/2011 | Yao et al. | |
| 2011/0097631 A1* | 4/2011 | Lee et al. | ...................... 429/400 |
| 2011/0241072 A1* | 10/2011 | Wang et al. | ................... 257/190 |
| 2012/0325139 A1 | 12/2012 | Wei et al. | |

FOREIGN PATENT DOCUMENTS

| | | |
|---|---|---|
| CN | 102263171 | 11/2011 |
| TW | 200833598 | 8/2008 |
| TW | 201109609 | 3/2011 |

* cited by examiner

*Primary Examiner* — Matthew Gordon
(74) *Attorney, Agent, or Firm* — Novak Druce Connolly Bove + Quigg LLP

(57) ABSTRACT

An epitaxial structure is provided. The epitaxial structure comprises a substrate, a carbon nanotube layer and an epitaxial layer stacked in that order. The substrate has an epitaxial growth surface and defines a plurality of first grooves and first bulges on the epitaxial growth surface. The carbon nanotube layer covers the epitaxial growth surface, wherein a first part of the carbon nanotube layer is attached on top surface of the first bulges, and a second part of the carbon nanotube layer is attached on bottom surface and side surface of the first grooves. The epitaxial layer is formed on the epitaxial growth surface, and the carbon nanotube layer is sandwiched between the epitaxial layer and the substrate.

17 Claims, 19 Drawing Sheets

US 9,048,347 B2

EPITAXIAL STRUCTURE INCLUDING CARBON NANOTUBE LAYER IN GROOVES

CROSS-REFERENCE TO RELATED APPLICATIONS

This application claims all benefits accruing under 35 U.S.C. §119 from China Patent Application No. 201210085254.9, filed on Mar. 28, 2012 in the China Intellectual Property Office, disclosure of which is incorporated herein by reference. This application is related to applications entitled, "METHOD FOR MAKING EPITAXIAL STRUCTURE", filed Aug. 24, 2012, Ser. No. 13/593,602; "METHOD FOR MAKING EPITAXIAL STRUCTURE", filed Aug. 24, 2012, Ser. No. 13/593,607; "METHOD FOR MAKING LIGHT EMITTING DIODE", filed Dec. 28, 2012, Ser. No. 13/729,224; "METHOD FOR MAKING LIGHT EMITTING DIODE", filed Dec. 28, 2012, Ser. No. 13/792,268; "METHOD FOR EPITAXIAL BASE", filed Oct. 9, 2012, 13/647,443; "EPITAXIAL BASE", filed Oct. 9, 2012, Ser. No. 13/647,444.

BACKGROUND

1. Technical Field

The present disclosure relates to an epitaxial base, a method for making the epitaxial base and an epitaxial structure.

2. Description of Related Art

Light emitting devices such as light emitting diodes (LEDs) based upon group III-V nitride semiconductors such as gallium nitride (GaN) have been used in many fields.

Since wide GaN substrates cannot be produced, the LEDs have been produced on a heteroepitaxial base such as sapphire. The use of sapphire substrate is problematic due to lattice mismatches and thermal expansion mismatches between the GaN and the sapphire substrates. One consequence of the thermal expansion mismatches is straining the GaN/sapphire substrate structure, which leads to cracking of the GaN/sapphire substrate and difficulty in fabricating devices with small feature sizes. A solution to cure the thermal expansion mismatches is to form a plurality of grooves on the surface of the sapphire substrate by lithography or by etching before growing the GaN layer. However, both the processes of lithography and etching are complex, high in cost, and may contaminate the sapphire substrate.

What is needed, therefore, is to provide a method for growing an epitaxial structure that overcomes the problems as discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial bases and methods for making the same.

Figure 1:
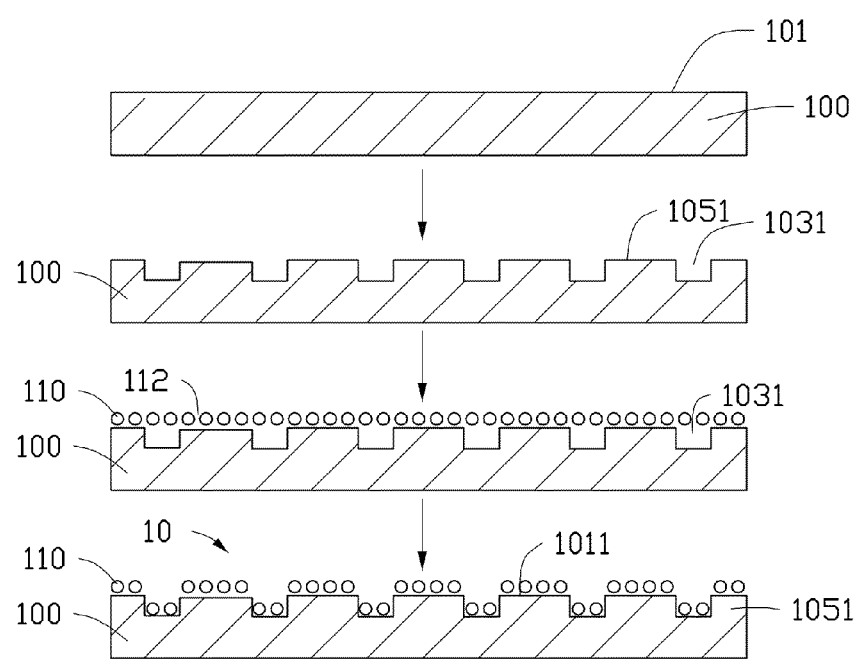
FIG. 1 is a flowchart of one embodiment of a method for making an epitaxial base.

Referring to FIG. 1, a method for making an epitaxial base 10 of one embodiment includes following steps:

(S11) providing a substrate 100 having an first epitaxial growth surface 101;

(S12) etching the first epitaxial growth surface 101 to form a plurality of first grooves 1031 and a plurality of first bulges 1051; and (S13) attaching a carbon nanotube layer 110 in the first grooves 1031 and top surface of the first bulges 1051 by treating the carbon nanotube layer 110.

Figure 14:
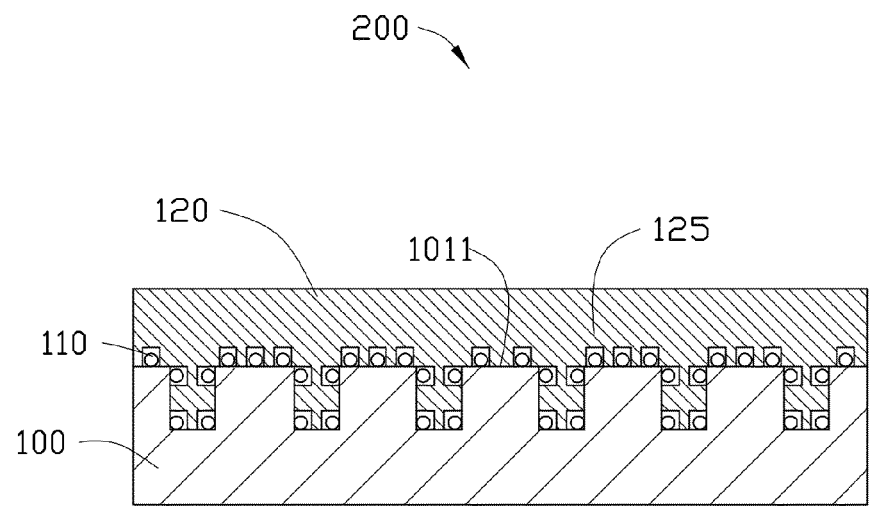
FIG. 14 is a schematic view of one embodiment of an epitaxial structure.

In step (S11), the first epitaxial growth surface 101 is used to grow an epitaxial layer 120 as shown in FIG. 14. The first epitaxial growth surface 101 is a very smooth surface. Oxygen and carbon are removed from the surface. The substrate 100 can be a single layer structure or a multiple layer structure. If the substrate 100 is a single layer structure, the substrate 100 can be a single-crystal structure. The single-crystal structure includes a crystal face which is used as the first epitaxial growth surface 101. The material of the substrate 100 can be SOI (Silicon on insulator), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The material of the substrate 100 is not limited, as long as the substrate 100 has a first epitaxial growth surface 101 on which the epitaxial layer 120 can grow. If the substrate 100 is a multiple layer structure, the substrate 100 should include at least one layer of the single-crystal structure mentioned previously. The material of the substrate 100 can be selected according to the epitaxial layer 120. In one embodiment, the lattice constant and thermal expansion coefficient of the substrate 100 is similar to the epitaxial layer 120 thereof in order to improve the quality of the epitaxial layer 120. In another embodiment, the material of the substrate 100 is sapphire. The thickness and the shape of the substrate 100 are arbitrary and can be selected according to need.

Figure 2:
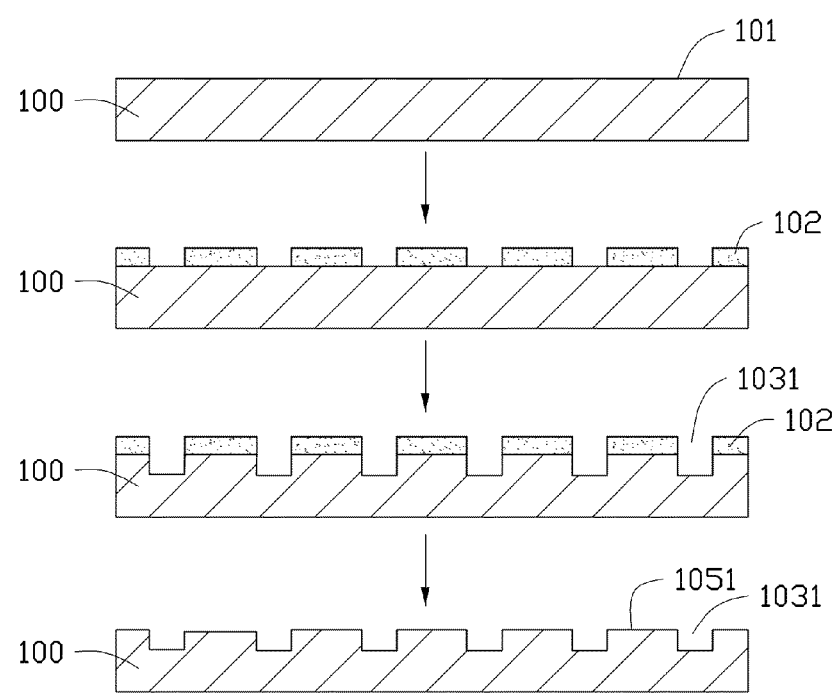
FIG. 2 is a flowchart of one embodiment of a method for making a patterned substrate.

In step (S12), the first epitaxial growth surface 101 can be etched via a method of wet etching or dry etching. Also referring to FIG. 2, the first epitaxial growth surface 101 is etched via the wet etching method in one embodiment. The method includes following steps:

(S121) placing a patterned mask layer 102 on the first epitaxial growth surface 101;

(S122) etching the first epitaxial growth surface 101 to form a patterned surface; and (S123) removing the mask layer 102.

In step (S121), the material of the mask layer 102 can be selected according to need, such as silicon dioxide, silicon nitride, silicon oxynitride, or titanium dioxide. The mask layer 102 can protect one part of the substrate 100 which is sheltered by the mask layer 102 from being corrupted by the solution. In one embodiment, the mask layer 102 is formed by following the steps:

(S1211) depositing a silicon dioxide film on the first epitaxial growth surface 101; and (S1212) etching the silicon dioxide film via lithography method to form a patterned mask layer 102.

In step (S1211), the silicon dioxide film can be deposited via CVD method. The thickness of the silicon dioxide ranges from about 0.3 micrometer to about 2 micrometer.

In step (S1212), the silicon dioxide film is etched by following steps:

first, placing a photo resist on the silicon dioxide film;

second, exposing and developing the photo resist to form a patterned photo resist; and third, etching the silicon dioxide film with a solution composed of $HF_4$ and the $NH_4F$ to form the patterned mask layer 102.

The pattern of the mask layer 102 is arbitrary and can be selected according to need. The pattern can be an array which is composed of a plurality of units. The shape of the unit can be round, rectangular, hexagonal, diamond, triangular or irregular shape or any combinations of them. In one embodiment, the shape of the unit is rectangular. The rectangles are parallel with each other and spaced in a certain interval. The distance between the two adjacent units ranges from about 1 μm to about 20 μm. The width of the rectangle ranges from about 1 μm to about 50 μm.

In step (S122), the first epitaxial growth surface 101 is etched by a solution including sulfuric acid and phosphoric acid. A first part of the first epitaxial growth surface 101 which is sheltered by the mask layer 102 will be retained, and a second part of the first epitaxial growth surface 101 which is exposed from the mask layer 102 will be dissolved in the solution. Thus the first epitaxial growth surface 101 is patterned. The volume ratio between the sulfuric acid and the phosphoric acid ranges from about 1:3 to about 3:1. The etching temperature ranges from about 300° C. to about 500° C., and the etching time ranges from about 30 seconds to about 30 minutes. The etching time can be selected according to the etching depth.

Figure 3:
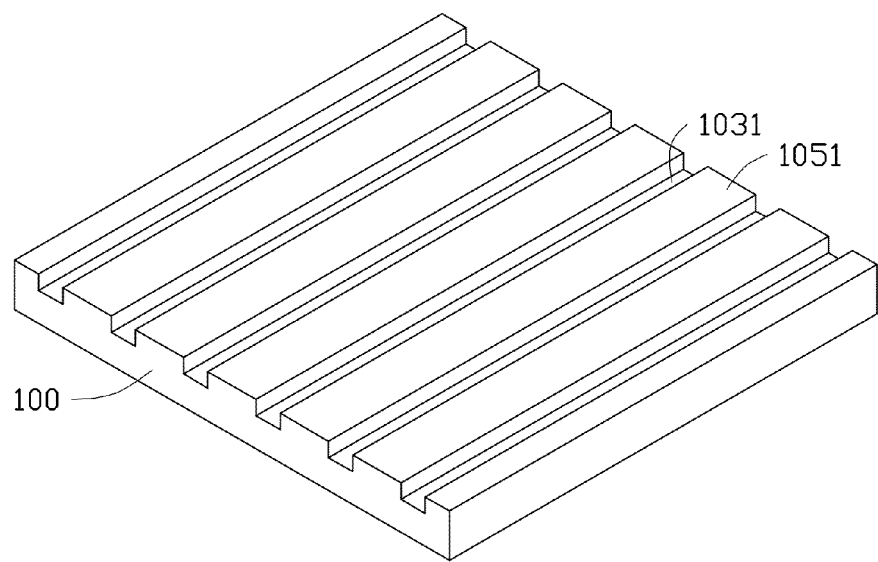
FIG. 3 is a schematic view of the patterned substrate in the method of FIG. 2.

Also referring to FIG. 3, the pattern of the patterned substrate 100 is similar to that of the mask layer 102. In one embodiment, the substrate 100 defines a plurality of first grooves 1031 and a plurality of first bulges 1051 parallel with each other on the first epitaxial growth surface 101. The areas between adjacent two of the first bulges 1051 are defined as the first grooves 1031. The first grooves 1031 can also be depressed from the first epitaxial growth surface 101 into the substrate 100. The areas between adjacent two of the plurality of first grooves 1031 are defined as the first bulges 1051. The shape of the first grooves 1031 and the shape of the first bulges 1051 are arbitrary can be chosen according to need. The size of the first grooves 1031 and the size of the first bulges 1051 is a range from about 1 um to about 50 um respectively. In one embodiment, the first grooves 1031 are bar-shaped structures extending along the same direction. In the direction perpendicular with the extending direction of the first grooves 1031, the first grooves 1031 are spaced from each other with an interval. The interval between adjacent two of the plurality of first grooves 1031 can be the same. The width of the first grooves 1031 ranges from about 1 μm to about 50 μm, and the interval between adjacent two of the plurality of first grooves 1031 ranges from about 1 μm to about 20 μm. The depth of the first grooves 1031 ranges from about 0.1 μm to about 1 μm. The depth of the first grooves 1031 can be selected according to need. Furthermore, the depth of the first grooves 1031 can be same.

Figure 4:
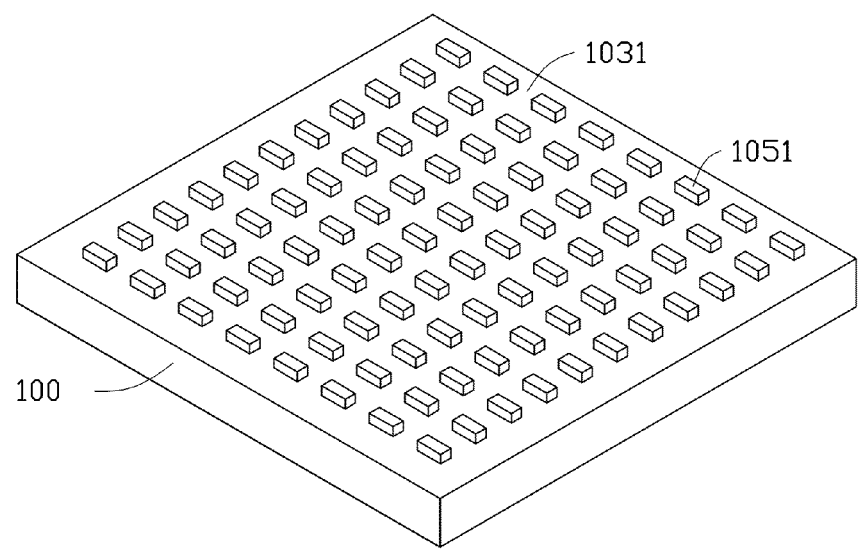
FIG. 4 is a schematic view of another patterned substrate.
Figure 5:
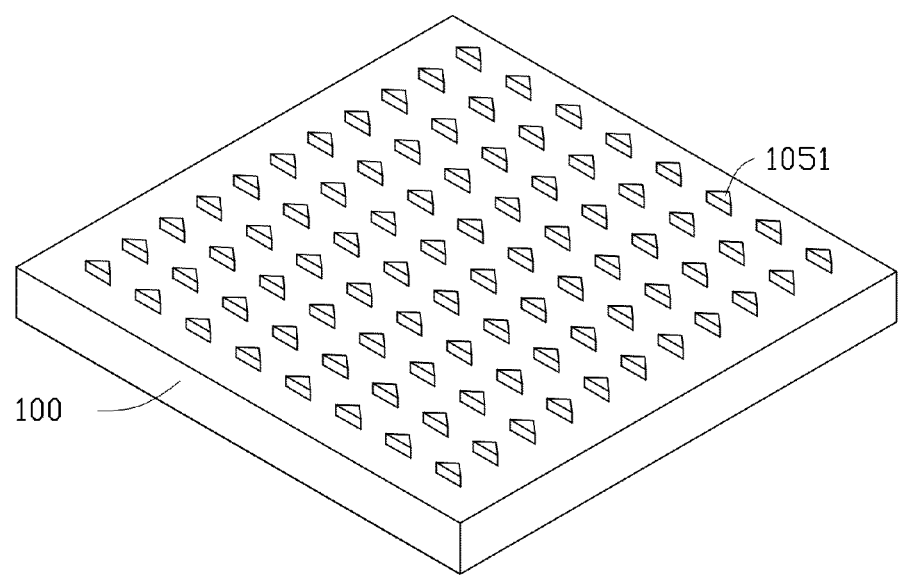
FIG. 5 is a schematic view of another patterned substrate.
Figure 6:
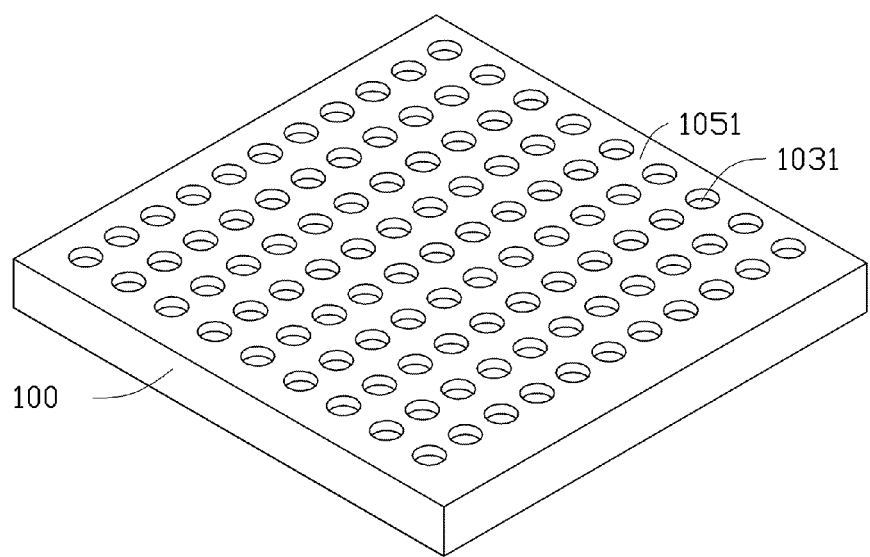
FIG. 6 is a schematic view of another patterned substrate.
Figure 7:
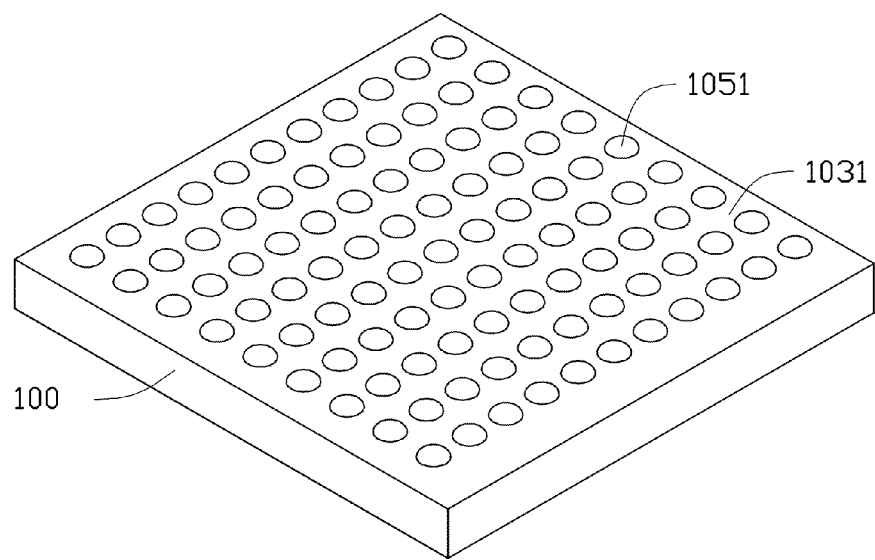
FIG. 7 is a schematic view of another patterned substrate.

Also referring to FIGS. 4-5, and 7, the first bulges 1051 can be a three-dimensional nano-structure extending out from the surface of the substrate 100. The shape of the first bugles 1051 can be a cube, cylinder, triangular prism, or hexagonal prism. The size of the first bugles 1051 ranges from about 0.1 um to about 20 um. The height of the first bulges 1051 ranges from about 0.1 um to about 1 um. The bottom surface of each of the first grooves 1031 and the top surface of each of the first bugles 1051 are defined as the second epitaxial growth surface 1011. Thus the second epitaxial growth surface 1011 is a patterned surface. Also referring to FIG. 6, the plurality of first grooves 1031 are nano-holes, and the areas between the plurality of the first grooves 1031 are defined as the first bulges 1051.

In step (S123), the mask layer 102 can be removed by dissolving in a $HF_4$ solution. Furthermore, the surface of the substrate 100 can be washed with de-ionized water to remove the residual impurity such as $HF_4$.

In step (S13), the carbon nanotube layer 110 can be formed by directly placing a carbon nanotube film on the second epitaxial growth surface 1011. The carbon nanotube layer 110 covers the second epitaxial growth surface 1011. The carbon nanotube layer 110 can be an ordered carbon nanotube structure or a disordered carbon nanotube structure. In one embodiment, the ordered carbon nanotube structure includes a plurality of carbon nanotubes extending along the same direction. The carbon nanotubes in the ordered carbon nanotube structure can also be arranged to extend along the crystallographic orientation of the substrate 100 or along a direction which forms an angle with the crystallographic orientation of the substrate 100. The carbon nanotube layer 110 includes a first part and a second part. The first part covers the top surface of the bugles 105. The second part is suspended above the first grooves 1031. The carbon nanotube layer 110 is a continuous and integrated structure and includes a plurality of carbon nanotubes. The carbon nanotubes extend parallel with the surface of the carbon nanotube layer 110.

The carbon nanotube layer 110 includes a plurality of carbon nanotubes. The carbon nanotubes in the carbon nanotube layer 110 can be single-walled, double-walled, or multi-walled carbon nanotubes. The length and diameter of the carbon nanotubes can be selected according to need. The thickness of the carbon nanotube layer 110 can be in a range from about 1 nm to about 100 µm, for example 10 nm, 100 nm, 200 nm, 1 µm, 10 µm or 50 µm. The carbon nanotube layer 110 forms a pattern so that part of the second epitaxial growth surface 1011 can be exposed from the patterned carbon nanotube layer 110 after the carbon nanotube layer 110 is placed on the second epitaxial growth surface 1011. Thus, the epitaxial layer 120 can grow from the exposed second epitaxial growth surface 1011. The carbon nanotube layer 110 is a patterned structure.

The term "patterned structure" means that the carbon nanotube layer 110 defines a plurality of apertures 112 penetrating the carbon nanotube layer 110 perpendicular to the surface of the carbon nanotube layer 110. The apertures 112 can be micro-holes formed by the adjacent carbon nanotubes. The apertures 112 can also be gaps formed by the adjacent carbon nanotubes aligned parallel with each other along the axial direction of the carbon nanotubes. If the apertures 112 are micro-holes, the diameter of the micro-hole range from about 10 nm to about 500 µm. If the apertures 112 are gaps, the average width of the gap ranges from about 10 nm to about 500 nm. The carbon nanotube layer 110 can have both micro-holes and gaps at the same time. The diameter of the micro-hole and the width of the gap can be different. In one embodiment, the apertures 112 are uniformly distributed in the carbon nanotube layer 110.

Both the diameter of the micro-hole and the width of the gap are defined as "the size of the apertures" in the following description. The size of the apertures 112 range from about 10 nm to about 500 µm, such as 1 micrometer, 10 micrometer 80 µm, or 120 µm. The smaller the size of the apertures 112, the fewer dislocations exist in the process of growing the epitaxial layer, and the higher the quality of epitaxial layer 120. In one embodiment, the size of the apertures 112 range from about 10 nm to about 10 µm. Furthermore, the duty cycle of the carbon nanotube layer 110 ranges from about 1:100 to about 100:1 such as 1:10, 1:2, 1:4, 4:1, 2:1, or 10:1. "Duty cycle" is defined as the area ratio between the second epitaxial growth surface 1011 which is covered by carbon nanotubes and the exposed surface which is exposed via the apertures 112. In one embodiment, the duty cycle of the carbon nanotube layer 110 ranges from about 1:4 to about 4:1.

The carbon nanotubes of the carbon nanotube layer 110 can be arranged orderly to form an ordered carbon nanotube structure or disorderly to form a disordered carbon nanotube structure. The term 'disordered carbon nanotube structure' includes, but is not limited to, to a structure where the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, to a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer 110 are arranged to extend along the direction substantially parallel to the surface of the carbon nanotube layer 110 in order to obtain a better pattern and greater light transmission. After being placed on the second epitaxial growth surface 1011, the carbon nanotubes in the carbon nanotube layer 110 are arranged to extend along the direction substantially parallel to the second epitaxial growth surface 1011. In one embodiment, all the carbon nanotubes in the carbon nanotube layer 110 are arranged to extend along the same direction. In another embodiment, part of the carbon nanotubes in the carbon nanotube layer 110 are arranged to extend along a first direction, and the other part of the carbon nanotubes in the carbon nanotube layer 110 are arranged to extend along a second direction. The first direction is perpendicular to the second direction. The carbon nanotubes in the ordered carbon nanotube structure can be arranged to extend along the crystallographic orientation of the substrate 100 or along a direction which forms an angle with the crystallographic orientation of the substrate 100.

The carbon nanotube layer 110 can be formed on the second epitaxial growth surface 1011 by CVD, transfer printing a preformed carbon nanotube film, filtering and depositing a carbon nanotube suspension. However, all of the above described methods need an assistant support. In one embodiment, the carbon nanotube layer 110 is a free-standing structure and can be drawn from a carbon nanotube array. The term "free-standing structure" means that the carbon nanotube layer 110 can sustain the weight of itself when it is hoisted by a portion thereof without any significant damage to its structural integrity. Thus, the carbon nanotube layer 110 can be suspended by two spaced supports. The free-standing carbon nanotube layer 110 can be laid on the second epitaxial growth surface 1011 directly and easily.

The carbon nanotube layer 110 can be a substantially pure structure of the carbon nanotubes, with few impurities and chemical functional groups. The carbon nanotube layer 110 can be a composite including a carbon nanotube matrix and some non-carbon nanotube materials. The non-carbon nanotube materials can be graphite, graphene, silicon carbide, boron nitride, silicon nitride, silicon dioxide, diamond, or amorphous carbon. Also, the non-carbon nanotube materials can be metal carbides, metal oxides, or metal nitrides. The non-carbon nanotube materials can be coated on the carbon nanotubes of the carbon nanotube layer 110 or filled in the apertures 112. In one embodiment, the non-carbon nanotube materials are coated on the carbon nanotubes of the carbon nanotube layer 110 so the carbon nanotubes have greater diameter and the apertures 112 have smaller size. The non-carbon nanotube materials can be deposited on the carbon nanotubes of the carbon nanotube layer 110 by CVD or physical vapor deposition, such as sputtering.

Furthermore, the carbon nanotube layer 110 can be treated with an organic solvent after being placed on the second epitaxial growth surface 1011 so the carbon nanotube layer 110 can be attached on the second epitaxial growth surface 1011 firmly. Specifically, the organic solvent can be applied to the entire surface of the carbon nanotube layer 110 or the entire carbon nanotube layer 110 can be immersed in an organic solvent. The organic solvent can be volatile, such as ethanol, methanol, acetone, dichloroethane, chloroform, or mixtures thereof. In one embodiment, the organic solvent is ethanol.

The carbon nanotube layer 110 can include at least one carbon nanotube film, at least one carbon nanotube wire, or combination thereof. In one embodiment, the carbon nanotube layer 110 can include a single carbon nanotube film or two or more stacked carbon nanotube films. Thus, the thickness of the carbon nanotube layer 110 can be controlled by controlling the number of the stacked carbon nanotube films. The number of the stacked carbon nanotube films can be in a range from about 2 to about 100, for example 10, 30, or 50. In one embodiment, the carbon nanotube layer 110 can include a layer of parallel and spaced carbon nanotube wires. Also, the carbon nanotube layer 110 can include a plurality of carbon nanotube wires crossed, or weaved together to form a carbon nanotube net. The distance between two adjacent parallel and spaced carbon nanotube wires can be in a range from about 0.1 μm to about 200 μm. In one embodiment, the distance between two adjacent parallel and spaced carbon nanotube wires can be in a range from about 10 μm to about 100 μm. The gap between two adjacent substantially parallel carbon nanotube wires is defined as one of the apertures 112. The size of the apertures 112 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 8:
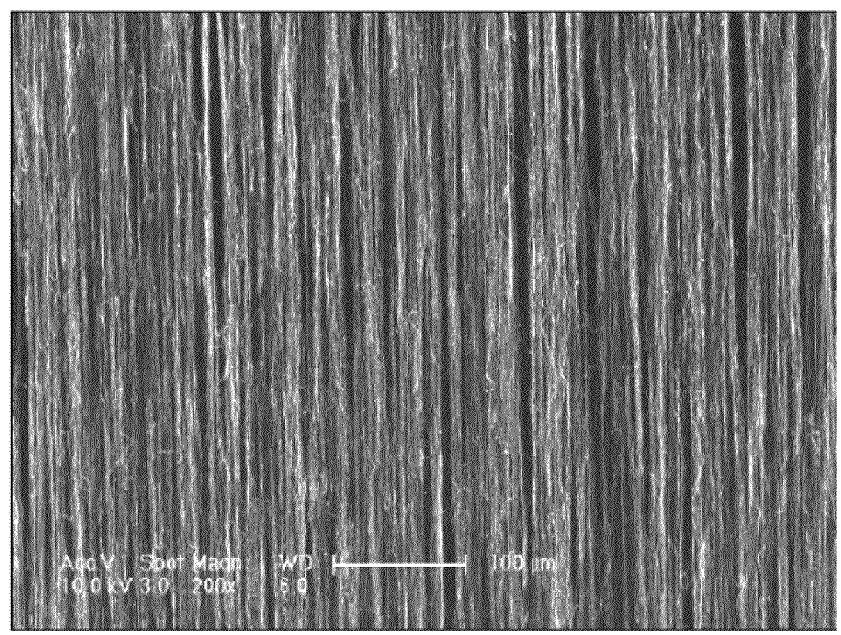
FIG. 8 is a scanning electron microscope (SEM) image of a drawn carbon nanotube film in the method of FIG. 1.
Figure 9:
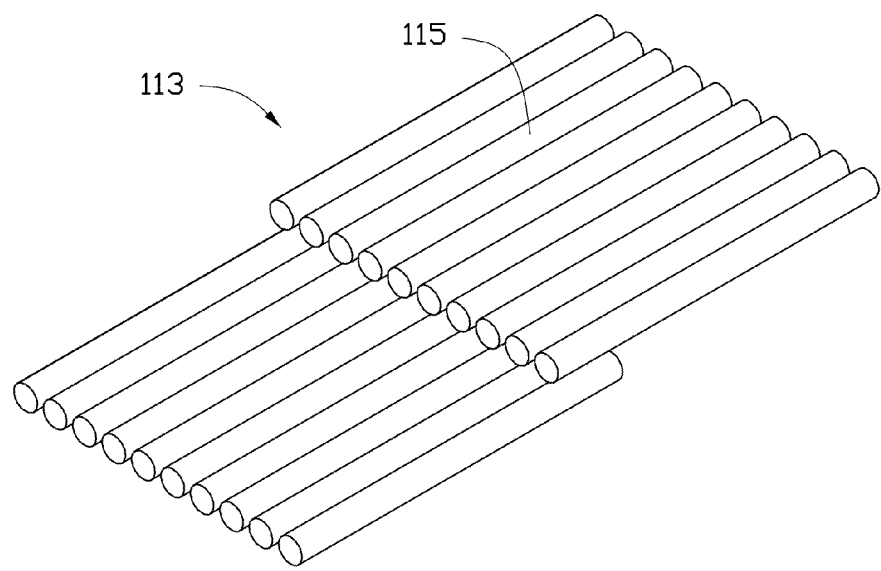
FIG. 9 is a schematic structural view of a carbon nanotube segment of the drawn carbon nanotube film of FIG. 8.

In one embodiment, the carbon nanotube layer 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 8 and 9, each drawn carbon nanotube film includes a plurality of successively oriented carbon nanotube segments 113 joined end-to-end by van der Waals attractive force therebetween. Each carbon nanotube segment 113 includes a plurality of carbon nanotubes 115 parallel to each other, and combined by van der Waals attractive force therebetween. As can be seen in FIG. 8, some variations can occur in the drawn carbon nanotube film. The carbon nanotubes 115 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nm to about 100 μm. The drawn carbon nanotube film can be attached to the second epitaxial growth surface 1011 directly.

Figure 10:
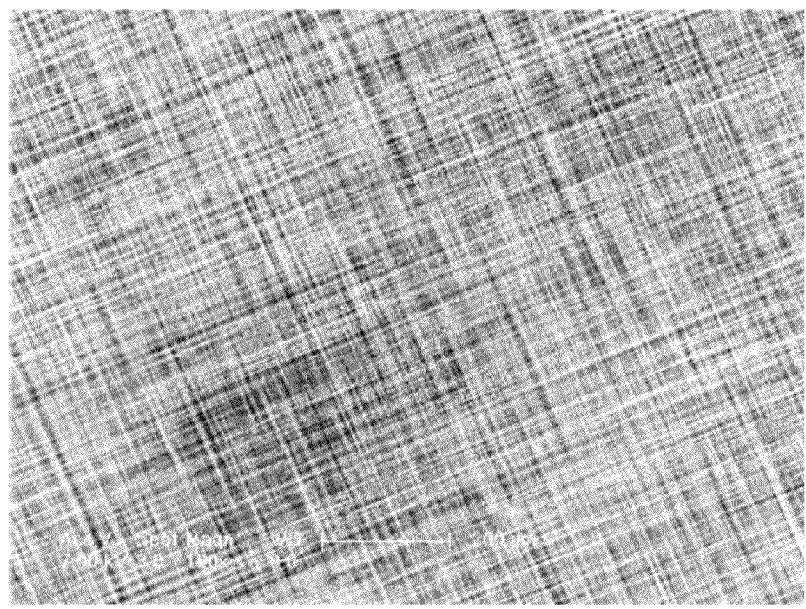
FIG. 10 is an SEM image of the drawn carbon nanotube films which are overlapped.

Also referring to FIG. 10, the carbon nanotube layer 110 can include at least two stacked drawn carbon nanotube films. In other embodiments, the carbon nanotube layer 110 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micro-holes is defined by the carbon nanotube layer 110. Referring to FIG. 10, the carbon nanotube layer 110 is shown with the angle between the aligned directions of the carbon nanotubes in adjacent stacked drawn carbon nanotube films is 90 degrees. Stacking the carbon nanotube films will also add to the structural integrity of the carbon nanotube layer 110.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ W/m$^2$. The drawn carbon nanotube film can be heated by fixing the drawn carbon nanotube film and moving the laser device at an even/uniform speed to irradiate the drawn carbon nanotube film. When the laser irradiates the drawn carbon nanotube film, the laser is focused on the surface of drawn carbon nanotube film to form a laser spot. The diameter of the laser spot ranges from about 1 micron to about 5 millimeters. In one embodiment, the laser device is carbon dioxide laser device. The power of the laser device is 30 watts. The wavelength of the laser is 10.6 μm. The diameter of the laser spot is 3 mm. The velocity of the laser movement is less than 10 m/s. The power density of the laser is $0.053 \times 10^{12}$ W/m$^2$.

In another embodiment, the carbon nanotube layer 110 can include at least a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is 0 degrees to approximately 15 degrees. The greater the pressure applied, the smaller the angle formed. When the carbon nanotubes in the pressed carbon nanotube film are arranged along different directions, the carbon nanotube layer 110 can be isotropic.

In another embodiment, the carbon nanotube layer 110 includes a flocculated carbon nanotube film. The flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micro-holes defined therein. It is understood that the flocculated carbon nanotube film is very porous. Sizes of the micro-holes can be less than 10 μm. The porous nature of the flocculated carbon nanotube film will increase specific surface area of the carbon nanotube layer 110. Further, due to the carbon nanotubes in the carbon nanotube layer 110 being entangled with each other, the carbon nanotube layer 110 employing the flocculated carbon nanotube film has excellent durability, and can be fashioned into any desired shapes with a low risk to the integrity of the carbon nanotube layer 110. The flocculated carbon nanotube film, in some embodiments, is free-standing due to the carbon nanotubes being entangled and adhered together by van der Waals attractive force therebetween.

Figure 11:
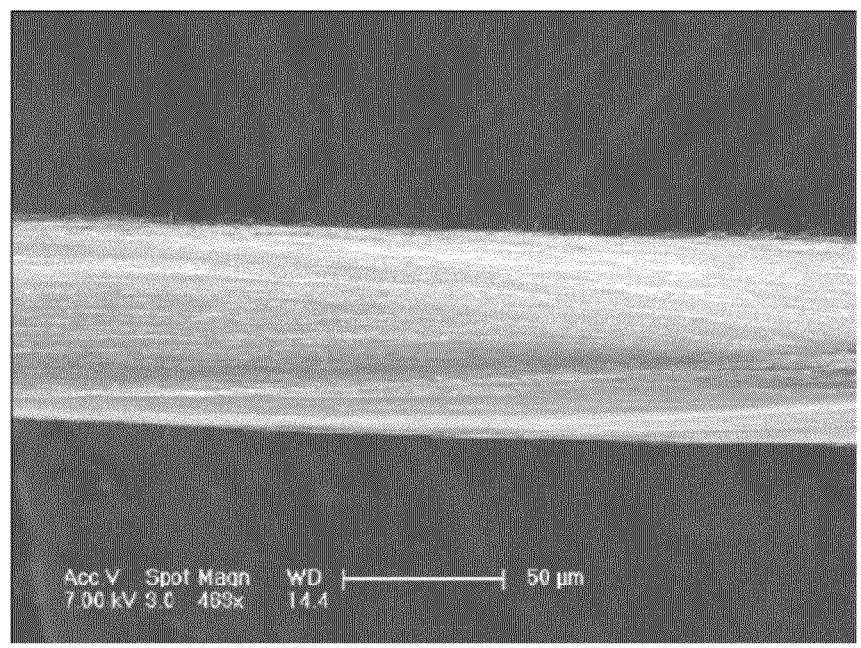
FIG. 11 is an SEM image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into untwisted carbon nanotube wire. Referring to FIG. 11, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity and shape. Length of the untwisted carbon nanotube wire can be arbitrarily set as desired. A diameter of the untwisted carbon nanotube wire ranges from about 0.5 nm to about 100 µm.

Figure 12:
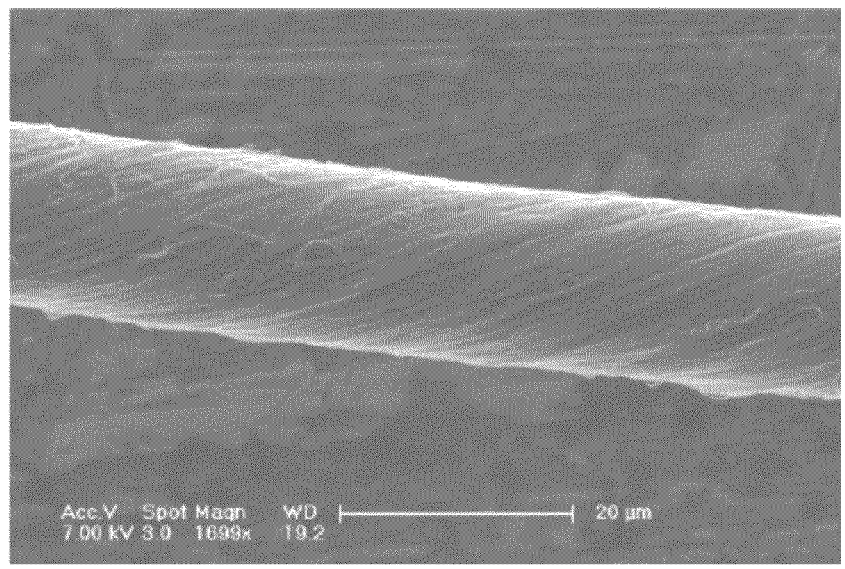
FIG. 12 is an SEM image of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 12, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 µm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizing. The specific surface area of the twisted carbon nanotube wire will decrease, while the density and strength of the twisted carbon nanotube wire will be increased.

In step (S13), the carbon nanotube layer 110 can be treated with volatile organic solvent, mechanical compression, or electrostatic adsorption. After the carbon nanotube layer 110 is treated, the second part of the carbon nanotube layer 110 can be separated from the first part, then falls in the first grooves 1031 and be attached on the bottom surface of the first grooves 1031, while the first part is still attached on the top surface of the first bulges 1051. In one embodiment, the carbon nanotube layer 110 is still maintained as a continuous and free-standing structure after the carbon nanotube layer is treated. The second part of the carbon nanotube layer 110 is attached both on the bottom surface and the side surface of the first grooves 1031.

In one embodiment, the carbon nanotube layer 110 is treated by dripping the organic solvent on it. Due to the surface tension of the organic solvent when the organic solvent volatilizing and the weight of the carbon nanotube layer 110, the second part of the carbon nanotube layer 110 which is suspended on the first grooves 1031 will be attached on the bottom surface and side surface of the grooves. Thus the entire carbon nanotube layer 110 is directly attached on the substrate 100. The size of apertures 112 of the carbon nanotube layer 110 can also be enlarged.

Figure 13:
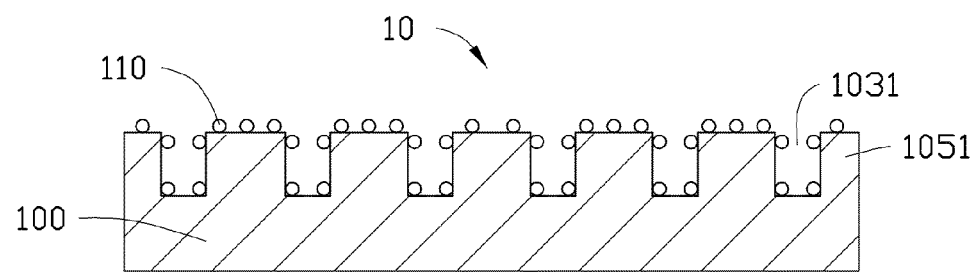
FIG. 13 is a schematic view of one embodiment of the epitaxial base.

Referring to FIG. 13, an epitaxial base 10 provided in one embodiment includes a substrate 100 and a carbon nanotube layer 110. The substrate 100 defines a plurality of first grooves 1031 and a plurality of first bulges 1051 to form a patterned surface which is used as a second epitaxial growth surface 1011. The carbon nanotube layer 110 covers the second epitaxial growth surface 1011. The carbon nanotube layer 110 includes a first part attached on the top surface of the first bulges 1051, and a second part attached on the bottom surface and side surface of the first grooves 1031.

The first grooves 1031 are intersected or are parallel with each other, and the areas between adjacent one of the first grooves 1031 are defined as the first bulges 1051. The first grooves 1031 can be a plurality of holes or channels. The carbon nanotube layer 110 includes a plurality of carbon nanotubes connected end to end by van der Waals force. The carbon nanotubes substantially extend along the same direction. The extending direction of the carbon nanotubes is parallel with the surface of the second epitaxial growth surface 1011. The extending direction of the carbon nanotubes can be parallel with, perpendicular with or intersected with the extending direction of the first grooves 1031. The carbon nanotube layer 110 covers the entire second epitaxial growth surface 1011.

The epitaxial base 10 and the method for making the same have the following advantages. First, the carbon nanotube layer is a continuous and free-standing structure, thus the carbon nanotube layer can be directly placed on the epitaxial growth surface, and the process is simple. Second, the base is a patterned structure, thus the lattice defects in making the epitaxial layer will be reduced. Third, because of the existence of the carbon nanotube layer, the epitaxial layer can only grow through the apertures of the carbon nanotube layer, thus the lattice defects will be reduced and the quality of the epitaxial layer will be improved. Fourth, the base defines a plurality of grooves and bulges on the epitaxial growth surface, and the carbon nanotube layer is located thereon, thus the contact surface between the epitaxial layer and the base is reduced, and the stress between them will be reduced.

Figure 15:
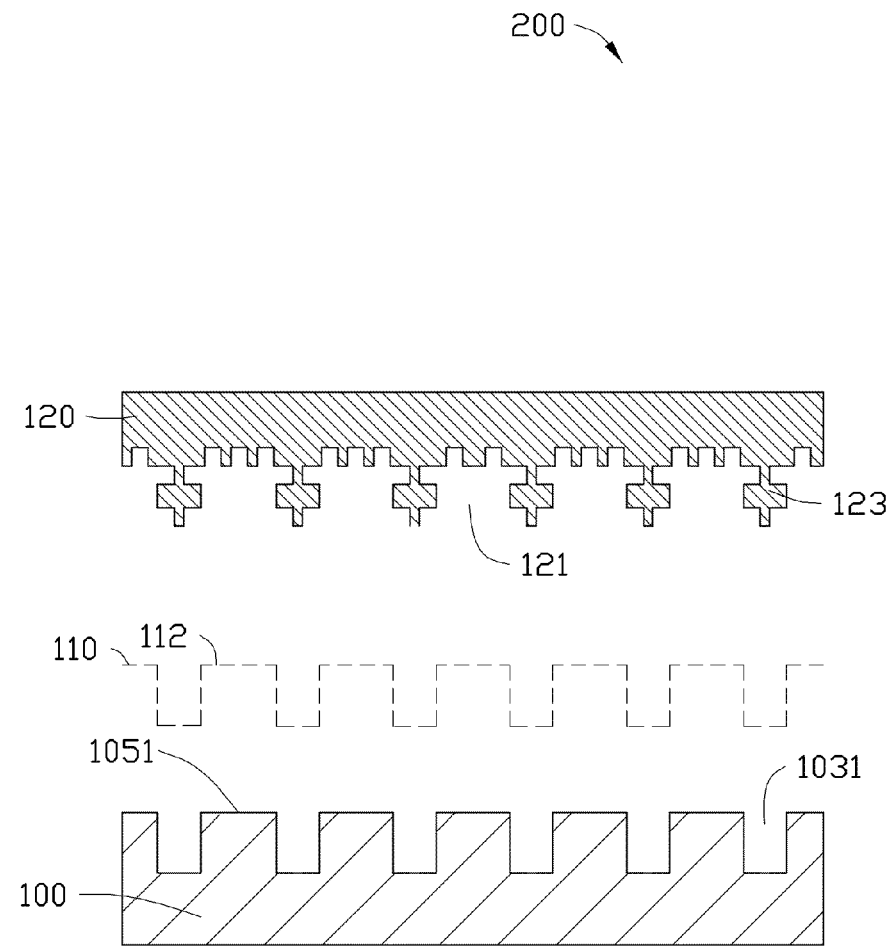
FIG. 15 is a schematic decomposition view of the epitaxial structure of FIG. 14.

Referring to FIGS. 14-15, an epitaxial structure 200 provided in one embodiment includes a substrate 100, a carbon nanotube layer 110 and an epitaxial layer 120. The substrate 100 defines a plurality of first grooves 1031 and a plurality of first bulges 1051 to form a patterned second epitaxial growth surface 1011. The carbon nanotube layer 110 is sandwiched between the epitaxial layer 120 and the second epitaxial growth surface 1011.

The carbon nanotube layer 110 is a continuous and free-standing structure and covers the second epitaxial growth surface 1011. The carbon nanotube layer 110 includes a first part attached on the top surface of the first bulges 1051, and a second part attached on the bottom surface and side surface of the first grooves 1031. The epitaxial layer 120 covers the carbon nanotube layer 110 and the second epitaxial growth surface 1011. The carbon nanotube layer 110 defines a plurality of apertures 112, and the epitaxial layer 120 is in contact with the substrate 100 through the apertures 112.

The epitaxial layer 120 is a single crystal layer grown on the second epitaxial growth surface 1011 by epitaxy growth. The material of the epitaxial layer 120 can be the same as or different from the material of the substrate 100. When the epitaxial layer 120 and the substrate 100 have the same material, the epitaxial layer 120 is called homogeneous epitaxial layer. When the epitaxial layer 120 and the substrate 100 have different material, the epitaxial layer 120 is called heteroepitaxial epitaxial layer.

The surface of the epitaxial layer 120 which is in contact with the substrate 100 is a patterned surface coupled with the patterned second epitaxial growth surface 1011. The patterned surface of the epitaxial layer 120 defines a plurality of second grooves 121 engaged with the first bulges 1051, and a plurality of second bulges 123 engaged with the first grooves 1031. The patterned surface of the epitaxial layer 120 also defines a plurality of holes 125 dispersed on the surface of the second grooves 121 and the second bulges 123. The carbon nanotubes of the carbon nanotube layer 110 are embedded in the holes 125.

The material of the epitaxial layer 120 can be semiconductor, metal or alloy. The semiconductor can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or $Co_2MnGa$. The thickness of the epitaxial layer 120 can be prepared according to needed. The thickness of the epitaxial layer 120 can be in a range from about 100 nm to about 500 μm, for example 200 nm, 500 nm, 1 μm, 2 μm, 5 μm, 10 μm, 50 μm.

A method of one embodiment for growing an epitaxial layer 120 using the epitaxial base 10 includes following steps:

(S15) providing an epitaxial base 10 having an second epitaxial growth surface 1011; and (S16) growing an epitaxial layer 120 on the second epitaxial growth surface 1011.

In step (S15), the epitaxial base 10 includes a substrate 100 and a carbon nanotube layer 110. The substrate 100 defines a plurality of first grooves 1031 and a plurality of first bulges 1051 to form a patterned surface referred as the second epitaxial growth surface 1011. The carbon nanotube layer 110 covers the entire second epitaxial growth surface 1011. The carbon nanotube layer 110 includes a first part and a second part. The first part of the carbon nanotube layer 110 contacts and covers on the top surface of the first bulges 1051. The second part of the carbon nanotube layer 110 which corresponds with the first grooves 1031 contacts and covers on the bottom surface and side surface of the first grooves 1031.

In step (S16), the epitaxial layer 120 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

In one embodiment, the epitaxial layer 120 is made by MOCVD, and the growth of the epitaxial layer 120 is heteroepitaxial growth. In the MOCVD, the nitrogen source gas is high-purity ammonia ($NH_3$), the carrier gas is hydrogen ($H_2$), the Ga source gas can be trimethyl gallium (TMGa) or triethyl gallium (TEGa), and the Si source gas is silane ($SiH_4$). The growth of the epitaxial layer 120 includes the following steps:

(S161) placing the epitaxial base 10 with the carbon nanotube layer 110 thereon into a reaction chamber and heating the epitaxial base 10 to 1100° C.~1200° C., introducing the carrier gas and baking the epitaxial base 10 for about 200 seconds to about 1000 seconds;

(S162) cooling down the temperature to a range from about 500° C. to 650° C. in the carrier gas atmosphere, introducing the Ga source gas and the nitrogen source gas at the same time to grow the low-temperature GaN layer;

(S163) stopping introducing the Ga source gas in the carrier gas and nitrogen source gas atmosphere, increasing the temperature to a range from about 1100° C. to about 1200° C. and keeping for about 30 seconds to about 300 seconds;

(S164) keeping the temperature of the epitaxial base 10 in a range from about 1000° C. to about 1100° C., introducing the Ga source gas again and the Si source gas to grow the high quality epitaxial layer 120.

The growth of the epitaxial layer 120 includes following stages:

First stage, a plurality of epitaxial crystal nucleus forms on the entire exposed second epitaxial growth surface 1011, and the epitaxial crystal nucleus grows to a plurality of epitaxial crystal grains along the direction perpendicular the second epitaxial growth surface 1011;

Second stage, the plurality of epitaxial crystal grains grows to a continuous epitaxial film along the direction parallel to the second epitaxial growth surface 1011;

Third stage, the epitaxial film continuously grows along the direction perpendicular to the second epitaxial growth surface 1011 to form a high quality epitaxial film, the epitaxial growth grains, epitaxial film and the high-quality epitaxial film constitute the epitaxial layer 120.

In the first stage, because the carbon nanotube layer 110 is located on the second epitaxial growth surface 1011 and defines a plurality of apertures 112, the epitaxial crystal grains are grown from the exposed second epitaxial growth surface 1011 through the apertures 112. The process of epitaxial crystal grains which grow along the direction substantially perpendicular to the second epitaxial growth surface 1011 is called vertical epitaxial growth. The first part of the carbon nanotube layer 110 directly contacts and covers the second epitaxial growth surface 1011, the epitaxial crystal grains grow from the apertures 112 of the carbon nanotube layer 110.

In the second stage, the epitaxial crystal grains can grow along the direction parallel to the second epitaxial growth surface 1011. The epitaxial crystal grains are gradually joined together to form the epitaxial film to cover the carbon nanotube layer 110. During the growth process, the epitaxial crystal grains will grow around the carbon nanotubes, and then a plurality of holes 125 will be formed in the epitaxial layer 120 where the carbon nanotubes existed. The extending direction of the holes 125 is parallel to the orientated direction of the carbon nanotubes. The carbon nanotubes are located into the holes 125 and enclosed by the epitaxial layer 120 and the substrate 100. An inner wall of the holes 125 can be in contact with or spaced from the carbon nanotubes, which depends on the wetting property between the material of the epitaxial film and the carbon nanotubes. There is at least one carbon nanotube in each of the plurality of holes 125. The carbon nanotubes in the holes 125 are joined by van der Waals force to form the carbon nanotube layer 110. The pattern of the holes 125 correspond to the patterned carbon nanotube layer 110. The shape of the cross section of the holes 125 can be square, and a width of the holes 125 ranges from about 20 nm to about 200 nm. The plurality of holes 125 forms a patterned surface on the epitaxial layer 120. The patterned surface of the epitaxial layer 120 is similar to the carbon nanotube layer 110.

While the carbon nanotube layer 110 includes a carbon nanotube film or a plurality of intersecting carbon nanotube wires, the plurality of holes 125 is interconnected with each other to form a continuous network structure. The carbon nanotubes are also interconnected with each other to form a conductive structure. While the carbon nanotube layer 110 includes a plurality of carbon nanotube wires parallel to each other, the plurality of holes 125 are parallel to each other as well. The holes 125 are aligned with a certain interval, and the distance between adjacent two of the plurality of holes 125 is substantially equal to the distance between the two adjacent carbon nanotube wires.

In the third stage, the epitaxial layer 120 covers the carbon nanotube layer 110, and contacts with the substrate 100 through the apertures 112. The epitaxial layer 120 is filled into the first grooves 1031. Due to the carbon nanotube layer 110 and the first grooves 1031, the lattice dislocation between the epitaxial crystal grains and the substrate 100 will be reduced during the growing process, thus the epitaxial layer 120 has less defects therein.

Figure 16:
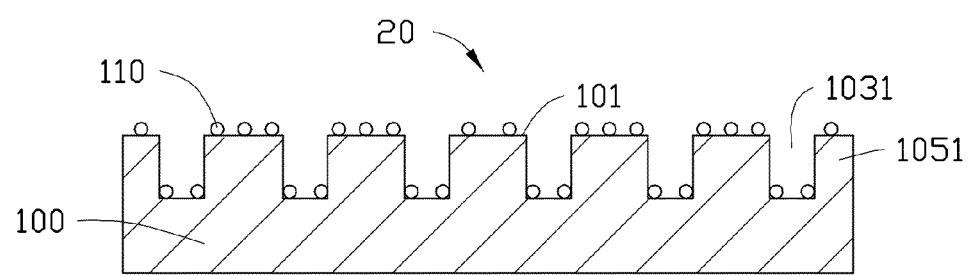
FIG. 16 is a schematic view of another embodiment of the epitaxial base.

Referring to FIG. 16, an epitaxial base 20 provided in one embodiment includes a substrate 100 and a carbon nanotube layer 110. The substrate 100 defines a plurality of first grooves 1031 and a plurality of first bulges 1051 to form a patterned surface which is used as a second epitaxial growth surface 1011. The carbon nanotube layer 110 covers the second epitaxial growth surface 1011. The carbon nanotube layer 110 includes a first part attached on the top surface of the first bulges 1051, and a second part attached on the bottom surface of the first grooves 1031.

The epitaxial base 20 is similar to the epitaxial base 10 except that the second part of the carbon nanotube layer 110 is only attached on the bottom surface of the first grooves 1031. The carbon nanotube layer 110 of the epitaxial base 20 is discontinuous and separated into a plurality of carbon nanotube units.

Figure 17:
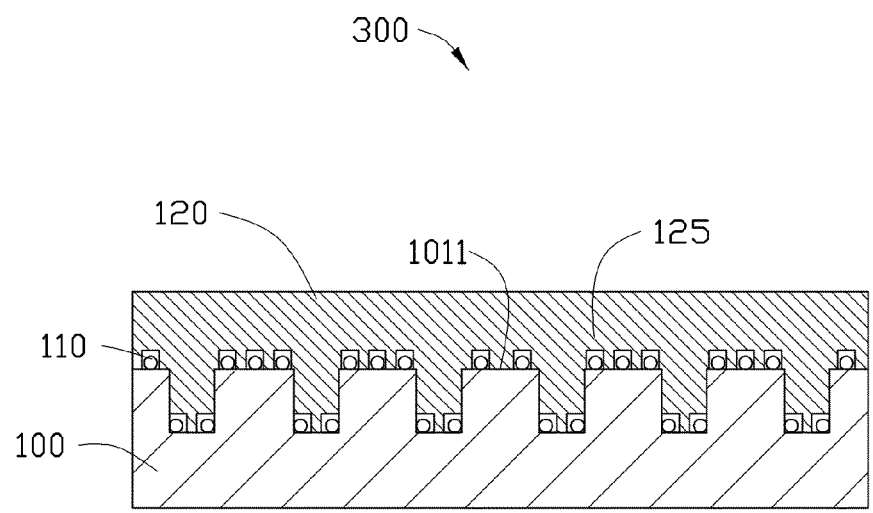
FIG. 17 is a schematic view of another embodiment of the epitaxial structure.
Figure 18:
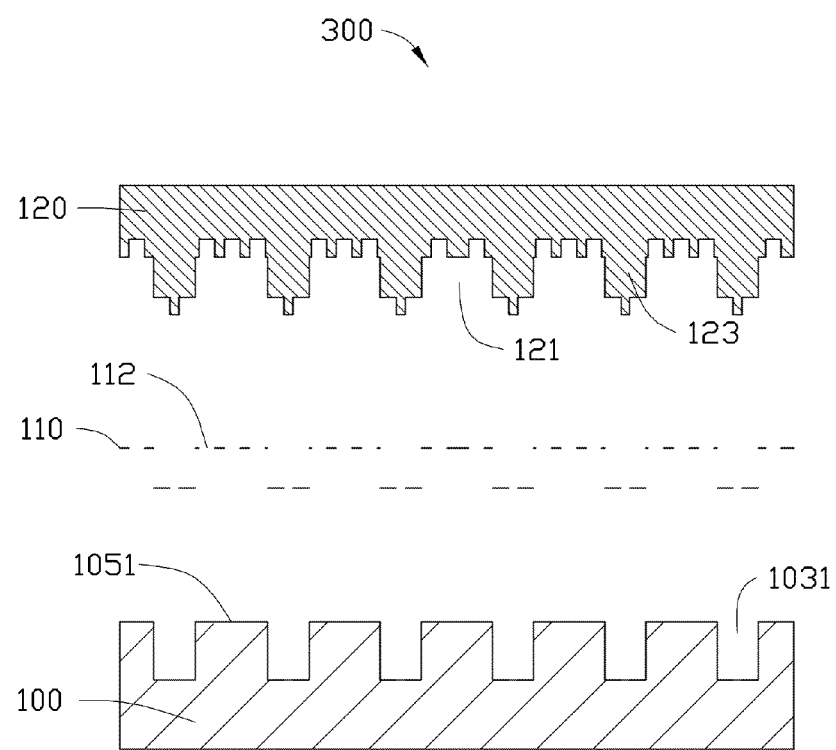
FIG. 18 is a schematic decomposition view of the epitaxial structure of FIG. 17.

Also referring to FIGS. 17 and 18, an epitaxial structure 300 provided in one embodiment includes a substrate 100, a carbon nanotube layer 110 and an epitaxial layer 120. The substrate 100 defines a plurality of first grooves 1031 and a plurality of first bulges 1051 to form a patterned second epitaxial growth surface 1011. The carbon nanotube layer 110 is sandwiched between the epitaxial layer 120 and the second epitaxial growth surface 1011. The carbon nanotube layer 110 defines a first part and a second part. The first part is attached on the top surface of the first bulges 1051, and the second part is attached on the bottom surface of the first grooves 1031.

The epitaxial structure 300 is similar to the epitaxial structure 200 except that the carbon nanotube layer 110 is discontinuous, and the second part of the carbon nanotube layer 110 is only attached on the bottom surface of the first grooves 1031. The side surface of the first grooves 1031 is smooth, and the epitaxial layer 120 is directly attached on the side surface of the first grooves 1031.

Figure 19:
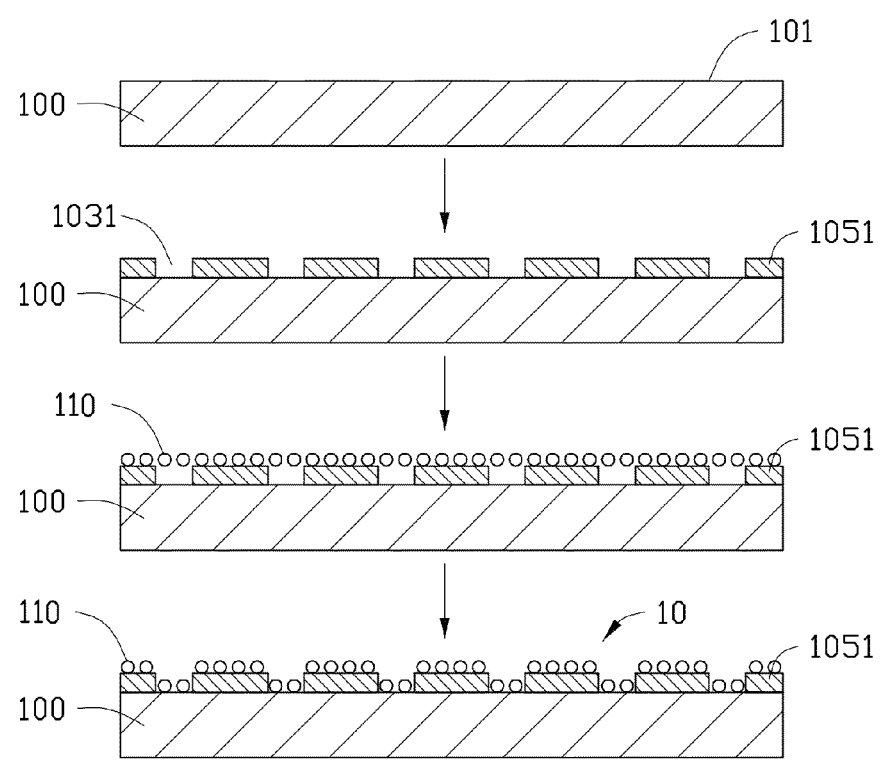
FIG. 19 is a flowchart of one embodiment of a method for making an epitaxial base.

Referring to FIG. 19, a method of one embodiment for making an epitaxial base 20 according to another embodiment includes the following steps:

(S21) providing a substrate 100 having an first epitaxial growth surface 101;

(S22) locating a plurality of first bulges 1051 on the first epitaxial growth surface 101 to form a patterned surface and define a plurality of first grooves 1031;

(S23) placing a carbon nanotube layer 110 on the patterned surface; and (S24) attaching the carbon nanotube layer 110 on bottom surface of the first grooves 1031 and top surface of the first bulges 1051.

The method of making the epitaxial base 20 is similar to the method of making the epitaxial base 10, except that the first bugles 1051 is located on the first epitaxial growth surface 101 to form the patterned surface.

In step (S22), the material of the first bulges 1051 can be the same as or different from the material of the substrate 100. The first bulges 1051 can also be directly located on the first epitaxial growth surface 101 to form a patterned surface which is used as a second epitaxial growth surface. In one embodiment, the method for making the first bulges 1051 includes the following steps:

(S221a) placing a layer-shaped structure (now shown) on the second epitaxial growth surface 1011; and (S221b) forming a plurality of first bulges 1051 by etching the layer-shaped structure.

In step (S221a), the material of the layer-shaped structure can be selected according to need, for example the silicon dioxide, silicon nitride, silicon oxynitride, or titanium dioxide. In one embodiment, the material is silicon dioxide.

In step (S221b), the layer-shaped structure is etched through the entire thickness of the layer-shaped structure to expose the first epitaxial growth surface 101. The plurality of first bulges 1051 forms a pattern which is arbitrary. In one embodiment, the plurality of first bulges 1051 is bar-shaped and parallel with and spaced from each other. The width of the first bulges 1051 ranges from about 1 µm to about 50 µm. The distance between adjacent two of the first bulges 1051 ranges from about 1 µm to about 20 µm. A first groove 1031 is defined between each of adjacent two of the first bulges 1051.

The first bulges 1051 can also be made by epitaxial growth method via a carbon nanotube layer referred to as a mask layer. In one embodiment, the method for making the first bulges 1051 includes following steps:

(S222a) placing a carbon nanotube layer (not shown) on the first epitaxial growth surface 101;

(S222b) growing a plurality of first bulges 1051 on the first epitaxial growth surface 101; and (S222c) forming the second epitaxial growth surface 1011 by removing the carbon nanotube layer.

In step (S222a), the carbon nanotube layer is configured as the mask layer to grow the first bulges 1051. The carbon nanotube layer can be an ordered carbon nanotube structure. The carbon nanotubes in the ordered carbon nanotube structure can also be arranged to extend along the crystallographic orientation of the substrate 100 or along a direction where an angle with the crystallographic orientation of the substrate 100 is formed. The structure of the second carbon nanotube layer is same as that of the carbon nanotube layer 110. The first bulges 1051 can only grow from the apertures 112 of the carbon nanotube layer. The carbon nanotube layer includes the plurality of apertures 112, thus the carbon nanotube layer can be configured as the patterned mask layer. While the carbon nanotube layer is located on the first epitaxial growth surface 101, the carbon nanotubes of the carbon nanotube layer are parallel to the first epitaxial growth surface 101.

In step (S222b), a plurality of epitaxial grains grows on the first epitaxial growth surface 101 to form the first bulges 1051. The growth direction of the epitaxial grains is perpendicular to the first epitaxial growth surface 101. The shape of the first bulges 1051 is the same as the shape of the apertures 112. In one embodiment, the carbon nanotubes of the carbon nanotube layer are oriented substantially along the same direction, thus the shape of the first bulges 1051 is in a shape of bar. The first bulges 1051 are parallel with each other and spaced from each other. The first bulges 1051 are oriented substantially along the same direction and parallel to the first epitaxial growth surface 101. The oriented direction of the first bulges 1051 is the same as the carbon nanotubes. The thickness of the first bulges 1051 can be equal to or smaller than that of the carbon nanotube layer. Thus, the first groove 1031 is defined between adjacent two of the first bulges 1051.

In one embodiment, the carbon nanotube layer includes a plurality of carbon nanotube films intersected with each other or a plurality of carbon nanotube wires intersected with each other. The epitaxial grains grow from the apertures 112 to form a plurality of dot-like first bulges 1051. The dot-like first bulges 1051 are dispersed on the first epitaxial growth surface 101. The maximum size of the dot-like first bulges 1051 ranges from about 10 nm to about 10 µm.

The material of the first bulges 1051 is arbitrary, and can be GaN, GaS and $Cu_3P_2$. The material of the first bulges 1051 can be same as the substrate 100. In one embodiment, the material of the first bulges 1051 is GaN.

In step (S222c), the carbon nanotube layer can be removed by plasma etching, ultrasonic oscillation, laser heating, or reaction chamber heating. In one embodiment, the carbon nanotube layer is removed by laser heating. The method of removing the carbon nanotube layer includes the following steps:

(c1) providing a laser device, irradiating the carbon nanotube layer with the laser transmitted by the laser device; and (c2) scanning the carbon nanotube layer with the laser in an oxidized atmosphere.

The laser device can be solid lasers, liquid lasers, gas lasers, or semiconductor lasers. The power density of the laser is greater than $0.053 \times 10^{12}$ watt/m$^2$. The diameter of the light spot ranges from about 1 mm to about 5 mm. The irradiation time is less than 1.8 second. In one embodiment, the laser device is $CO_2$ laser, the power density is about 30 watt, the wavelength is about 10.6 µm and the diameter of the light spot is about 3 mm.

The carbon nanotubes on the first epitaxial growth surface 101 can be ablated by the laser. The irradiation time of the laser can be controlled by controlling the moving speed of the laser relative to the carbon nanotube layer. The carbon nanotubes will be oxidized to $CO_2$. After the carbon nanotubes are removed, a plurality of first bulges 1051 is formed on the first epitaxial growth surface 101 and spaced from each other.

In step (S23), the carbon nanotube layer 110 is directly placed on the first bulge 1051 and covers the first bulges 1051. The carbon nanotube layer 110 includes a first part and a second part. The first part contacts and covers the surface of the first bulges 1051, and the second part is suspended between the two adjacent first bulges 1051 and spaced from the first epitaxial growth surface 101. The extending direction of the carbon nanotubes is parallel to or intersected with the extending direction of the bar-shaped first bulges 1051. In one embodiment, the extending direction of the carbon nanotubes is perpendicular to the extending direction of the first bulges 1051, thus the lattice defects during the growth of epitaxial layer will be reduced.

The epitaxial base, the method for making the epitaxial base and the method for growing the epitaxial layer on the epitaxial base has the following advantages. First, the epitaxial base is a patterned structure having a plurality of microstructures in micrometer scale, so the dislocation during the growth will be reduced. Second, the carbon nanotube layer is a patterned structure, the thickness and the aperture is in nanometer scale, thus the dislocation is further reduced and the quality of the epitaxial layer is improved. Third, due to the existence of the carbon nanotube layer, the contact surface and the stress between the epitaxial layer and the base will be reduced, thus the epitaxial base can be used to grow a relatively thicker epitaxial layer. Fourth, the carbon nanotube layer is a freestanding structure, thus it can be directly placed on the base, and the method is simple and low in cost. Fifth, the epitaxial layer grown on the epitaxial base has relatively less dislocation, so the epitaxial base can be used to produce electronics in higher performance.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. An epitaxial structure, comprising:
a substrate comprising an epitaxial growth surface and defining a plurality of first grooves comprising a plurality of top portions and a plurality of first bulges on the epitaxial growth surface;
a carbon nanotube layer covering the epitaxial growth surface, wherein a first part of the carbon nanotube layer is attached to top surfaces of the plurality of first bulges, and a second part of the carbon nanotube layer is attached to at least bottom surfaces of the plurality of first grooves while the plurality of top portions is substantially unoccupied by the carbon nanotube layer; and
an epitaxial layer formed on the epitaxial growth surface, and the carbon nanotube layer is sandwiched between the epitaxial layer and the substrate.

2. The epitaxial structure of claim 1, wherein the epitaxial layer is coupled with the epitaxial growth surface.

3. The epitaxial structure of claim 2, wherein the epitaxial layer defines a plurality of second grooves engaged with the plurality of first bulges, and a plurality of second bulges engaged in the plurality of first grooves.

4. The epitaxial structure of claim 2, wherein the surface of the epitaxial layer defines a plurality of holes, and the carbon nanotube layer is embedded in the plurality of holes.

5. The epitaxial structure of claim 1, wherein the carbon nanotube layer defines a plurality of apertures, and the epitaxial layer is in contact with the epitaxial growth surface through the plurality of apertures.

6. The epitaxial structure of claim 1, wherein each of the plurality of first grooves is bar-shaped and intersects with each other to form a patterned surface.

7. The epitaxial structure of claim 1, wherein each of the plurality of first grooves is bar-shaped and extends along a first direction.

8. The epitaxial structure of claim 7, wherein the carbon nanotube layer comprises a plurality of carbon nanotubes extending along a second direction perpendicular to the first direction.

9. The epitaxial structure of claim 8, wherein a width of each of the plurality of first groove ranges from about 1 micrometer to about 50 micrometers, a depth of each of the plurality of first groove ranges from about 0.1 micrometers to about 1 micrometer, and an interval between adjacent two of the plurality of first grooves ranges from about 1 micrometer to about 20 micrometers.

10. The epitaxial structure of claim 1, wherein each of the plurality of first bulges is bar-shaped, each of the plurality of first bulges being parallel with each other or intersected with each other.

11. The epitaxial structure of claim 1, wherein each of the plurality of first bulges is dot-shaped, the plurality of first bulges being dispersed on the epitaxial growth surface.

12. The epitaxial structure of claim 1, wherein the carbon nanotube layer comprises a carbon nanotube film or a plurality of carbon nanotube wires.

13. The epitaxial structure of claim 12, wherein the carbon nanotube film comprises a plurality of carbon nanotube segments, the plurality of carbon nanotubes being successively oriented and serially joined end-to-end.

14. The epitaxial structure of claim 13, wherein the plurality of carbon nanotube segments comprises a plurality of carbon nanotubes, the plurality of carbon nanotubes being arranged parallel with each other.

15. The epitaxial structure of claim 1, wherein the carbon nanotube layer comprises a plurality of carbon nanotube films stacked together.

16. The epitaxial structure of claim 1, wherein the carbon nanotube layer comprises a plurality of carbon nanotubes, the plurality of carbon nanotubes being arranged parallel with the epitaxial growth surface.

17. The epitaxial structure of claim 1, wherein the substrate is a single-crystal structure, and the carbon nanotube layer comprises a plurality of carbon nanotubes extending along a crystallographic orientation of the single-crystal structure.

* * * * *